(12) United States Patent
Kim

(10) Patent No.: US 7,687,889 B2
(45) Date of Patent: Mar. 30, 2010

(54) ORGANIC ELECTROLUMINESCENT DISPLAY DEVICE HAVING ELECTRICAL COMMUNICATION BETWEEN CONDUCTING LAYER AND CATHODE LAYER

(75) Inventor: Hak Su Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 152 days.

(21) Appl. No.: 11/317,170

(22) Filed: Dec. 27, 2005

(65) Prior Publication Data

US 2006/0231831 A1 Oct. 19, 2006

(30) Foreign Application Priority Data

| Apr. 19, 2005 | (KR) | ...................... 10-2005-0032426 |
| Apr. 19, 2005 | (KR) | ...................... 10-2005-0032437 |
| Apr. 19, 2005 | (KR) | ...................... 10-2005-0032438 |
| May 6, 2005 | (KR) | ...................... 10-2005-0037826 |

(51) Int. Cl.
*H01L 29/06* (2006.01)

(52) U.S. Cl. .................. 257/624; 257/210; 257/775; 257/776; 257/784; 257/E51.019

(58) Field of Classification Search ............... 257/624, 257/784, E51.019, 40, 83, 291, 629, E33.06, 257/E33.067, E27.131, E27.152, 210, 594, 257/773, 775, 776; 313/503, 169.3, 494, 313/500, 506; 438/158, 155

See application file for complete search history.

(56) References Cited

U.S. PATENT DOCUMENTS

| 5,756,371 A | * | 5/1998 | Ohno et al. ................... 438/30 |
| 6,101,042 A | | 8/2000 | Sato |
| 6,104,042 A | * | 8/2000 | Sah ............................. 257/59 |
| 7,132,667 B2 | * | 11/2006 | Petrick et al. .......... 250/370.09 |
| 2003/0122498 A1 | * | 7/2003 | Park ........................ 315/169.3 |
| 2004/0195961 A1 | | 10/2004 | Lin |
| 2005/0195355 A1 | * | 9/2005 | Kwak et al. ................. 349/149 |
| 2007/0065997 A1 | * | 3/2007 | Lin ............................ 438/158 |

* cited by examiner

*Primary Examiner*—Julio J Maldonado
(74) *Attorney, Agent, or Firm*—Birch, Stewart, Kolasch & Birch, LLP

(57) ABSTRACT

The present invention relates to a light emitting display device, such as an organic electroluminescent device, and a method for manufacturing the same. Particularly, the present invention relates to reducing electrical resistance between the scan lines and the cathode electrode layers so that scan line signals do not degrade significantly degrade. One way to achieve this is to use materials to form the conducting layers of the scan line and the cathode electrode layers such that the conductivities of the conducting layers and the cathode electrode layer are as identical as possible. For example, if a same metal such as aluminum is used to form both the conducting layer and the cathode electrode layer, the resistance would be significantly lowered. In addition, a large contacting area may be provided.

19 Claims, 10 Drawing Sheets

ORGANIC ELECTROLUMINESCENT DISPLAY DEVICE HAVING ELECTRICAL COMMUNICATION BETWEEN CONDUCTING LAYER AND CATHODE LAYER

BACKGROUND OF THE INVENTION

1. Field of the Invention

The present invention relates to a light emitting display device, such as an electroluminescent device, and a method for manufacturing the same. Particularly, the present invention relates to a light emitting display device that minimizes a resistance between connecting layers of scan lines and cathode electrode layers.

2. Description of the Prior Art

A light emitting display device, such as an organic electroluminescent device, emits light having a predetermined wavelength when a certain voltage is applied thereto.

FIG. 1a is a plane view illustrating a related art organic electroluminescent device. As illustrated, the related art organic electroluminescent device comprises anode electrode layers 100, cathode electrode layers 102 and scan lines 101.

A plurality of pixels 104 are formed in luminescent areas at the crossings of the anode electrode layers 100 and the cathode electrode layers 102. The scan lines 101 correspond to the cathode electrode layers 102.

FIG. 1b is a cross sectional view illustrating the related art organic electroluminescent device taken along the line I-I' of FIG. 1a. In FIG. 1b, each pixel 104 comprises the anode electrode layer 100, an organic layer 118 and the cathode electrode layer 102 stacked in sequence on a substrate 110.

Also as illustrated in FIG. 1b, the scan line 101 comprises a scan line electrode layer 112 and a sub-electrode layer 114 stacked in sequence on the substrate 110. The sub-electrode layer 114 is made of molybdenum. The sub-electrode layer 114 makes contact with the cathode electrode layer 102. Thus, scan signals transferred from an integrated circuit chip (not shown) are transferred to the cathode electrode layer 102 through the scan line electrode layer 112 and the sub-electrode layer 114.

The related art device suffers from at least the following problem. The resistance value of the sub-electrode layer 114 is relatively high. Also, the contact area between the sub-electrode layer 114 and the cathode electrode layer 102 is relatively small. As a result, the scan signals transferred to cathode electrode layer 102 through the scan line electrode layer 112 and the sub-electrode layer 114 are significantly reduced.

SUMMARY OF THE INVENTION

An object of the present invention is to provide a light emitting display device, such as an organic electroluminescent device, having scan lines with low resistance value.

Another object of the present invention is to provide a light emitting display device capable of electrically connecting conducting layers of scan lines and cathode electrode layers with similar conductivity with a large contacting area.

A light emitting display device according to an embodiment of the present invention, having luminescent areas formed by anode electrode layers and cathode electrode layers intersecting with the anode electrode layers, includes scan lines formed spaced apart from the anode electrode layers, having at least one via hole formed on the upper surface and conducting layers formed from materials with substantially identical conductivity as the cathode electrode layers, wherein the conducting layers are electrically connected to the cathode electrode layers respectively through the at least one via hole. Preferably, the conducting layers and the cathode electrode layers are formed from the same material such as aluminum.

Preferably, the scan line has a scan line electrode layer, a first sub-electrode layer, the conducting layer and a second sub-electrode layer stacked in sequence, and the at least one via hole is formed on the second sub-electrode layer, and extending to the conducting layer. Also, the conducting layer and the cathode electrode layer may be formed from aluminum, and the sub-electrode layers may be formed from molybdenum or chrome.

A light emitting display device according to various embodiments of the present invention, having anode electrode layers, insulating layer, organic layers and cathode electrode layers stacked in sequence, includes scan lines formed spaced apart from the anode electrode layers, having conducting layers formed from materials with substantially identical conductivity as the cathode electrode layers; and supporting layers formed between the scan lines and the anode electrode layers, wherein the cathode electrode layers are supported by the supporting layers, and electrically connected to the conducting layers respectively. Preferably, the conducting layers and the cathode electrode layers are formed from same conductive material such as aluminum.

Preferably, the scan line has a scan line electrode layer, a first sub-electrode layer, the conducting layer and a second sub-electrode layer stacked in sequence. Also, the conducting layers and the cathode electrode layers can be formed from aluminum and the sub-electrode layers can be formed from molybdenum or chrome.

Preferably, the height of supporting layer is same as the total height of scan line electrode layer and first sub-electrode layer. Also, the supporting layer consists of the same substance as the insulating layer.

A light emitting display device according to an embodiment of the present invention, having luminescent areas formed by anode electrode layers and cathode electrode layers intersecting with the anode electrode layers, comprises scan lines having conducting layers formed from materials with a conductivity substantially identical as the cathode electrode layers, wherein the conducting layer is exposed through at least a cut-out part formed at the end of the scan line, and electrically connected to the cathode electrode layer filled in the cut-out part. Preferably, the conducting layers and the cathode electrode layers can be formed from a same conducting metal such as aluminum.

Preferably, the scan line has a scan line electrode layer, a first sub-electrode layer, the conducting layer and a second sub-electrode layer stacked in sequence. Also, the conducting layers and the cathode electrode layers are formed from aluminum, and the sub-electrode layers are formed from molybdenum or chrome.

A light emitting display device according to an embodiment of the present invention, having luminescent areas formed by anode electrode layers and cathode electrode layers intersecting with the anode electrode layers, comprises scan lines formed spaced from the anode electrode layers, having conducting layers formed from materials with substantially identical conductivity as the cathode electrode layers, wherein the conducting layers and the cathode electrode layers are extended to the area between the scan lines and anode electrode layers, and connected respectively. Preferably, the conducting layers and the cathode electrode layers are formed from a same conducting material such as aluminum.

Preferably, the scan line has a scan line electrode layer, a first sub-electrode layer, the conducting layer and a second sub-electrode layer stacked in sequence. Also, the conducting layers and the cathode electrode layers are formed from aluminum, and the sub-electrode layers are formed from molybdenum or chrome.

A manufacturing method of a light emitting display device according to the present invention, comprises the steps of forming anode electrode layers and scan lines having conducting layers, spaced apart from each other on a substrate; forming insulating layer on the scan line and the anode electrode layer; patterning the insulating layer, and exposing luminescent areas on the anode electrode layer and a part of the conducting layer; forming organic layer on the luminescent area; and forming cathode electrode layer over the exposed conducting layer and the organic layer, and electrically connecting them.

Preferably, the scan line is formed by stacking a scan line electrode layer, a first sub-electrode layer, the conducting layer and a second sub-electrode layer in sequence. Also, the cathode electrode layer can be formed from a material with substantially identical conductivity as the conductive layer. Here, the conductive layers and the cathode electrode layers can both be formed from aluminum.

A manufacturing method of a light emitting display device according to an embodiment of the present invention comprises the steps of forming anode electrode layers and scan lines having conducting layers, spaced from each other on a substrate; forming insulating layer on the anode electrode layer, and exposing luminescent areas; forming supporting layers between the anode electrode layer and the scan line; forming organic layer on the luminescent area; and forming cathode electrode layer on the organic layer, wherein the cathode electrode layer is supported by the supporting layer and electrically connected the conducting layer. Preferably, the insulating layer and the supporting layer are simultaneously formed.

Preferably, the scan line is formed by stacking a scan line electrode layer, a first sub-electrode layer, the conducting layer and a second sub-electrode layer in sequence. Here, the height of supporting layer is substantially the same as the total height of scan line electrode layer and first sub-electrode layer. Also, the cathode electrode layer can be formed from a material with substantially identical conductivity as the conducting layer. Here, the conducting layers and the cathode electrode layers can be formed from aluminum.

A manufacturing method of a light emitting display device according to an embodiment of the present invention comprises the steps of forming anode electrode layers and scan lines having conducting layers, spaced apart from each other on a substrate; forming at least a cut-out part at the end of the scan line, and exposing the conducting layer; forming insulating layer on the anode electrode layer, and exposing luminescent areas; forming organic layer on the luminescent area; and forming cathode electrode layer on the organic layer, wherein the cathode electrode layer is formed to fill the cut-out part, and electrically connected to the conducting layer.

Preferably, the scan line is formed by stacking a scan line electrode layer, a first sub-electrode layer, the conducting layer and a second sub-electrode layer in sequence. Also, the cathode electrode layer can be formed from a material with substantially identical conductivity as the conducting layer. Here, the conducting layer and the cathode electrode layer can be formed from aluminum.

A manufacturing method of a light emitting display device according to an embodiment of the present invention, comprises the steps of forming anode electrode layers and scan lines having conducting layers, spaced apart from each other on a substrate, wherein the conducting layer is extended to the area between the anode electrode layer and the scan line; forming insulating layer on the anode electrode layer, and exposing luminescent areas; forming organic layer on the luminescent area; and forming cathode electrode layer on the organic layer, wherein the cathode electrode layer is connected to the extended conducting layer directly.

Preferably, the scan line is formed by stacking a scan line electrode layer, a first sub-electrode layer, the conducting layer and a second sub-electrode layer in sequence. Also, the cathode electrode layer can be formed from a material with substantially identical conductivity as the conducting layer. Here, the conducting layer and the cathode electrode layer can be formed from aluminum.

Because the scan line of the light emitting display device according to the embodiments of the present invention has layers with multi-layered structure on the scan line electrode layer, the resistance of the scan line is significantly reduced.

Also, because the cathode electrode layer and the conducting layer of the scan line have substantially identical conductivities and are electrically connected through a large contact area, the contact resistance between the cathode electrode layer and the conducting layer is significantly reduced.

BRIEF DESCRIPTION OF THE DRAWING

The present invention will be more clearly understood from the detailed description in conjunction with the following drawings.

FIG. 1b is a cross-sectional view of the related art organic electroluminescent device taken along line I-I' of FIG. 1a.

DETAILED DESCRIPTION OF THE INVENTION

Hereinafter, embodiments of the light emitting display devices and the method of manufacturing the same according to the present invention will be explained in more detail with reference to the accompanying drawings.

Figure 2A:
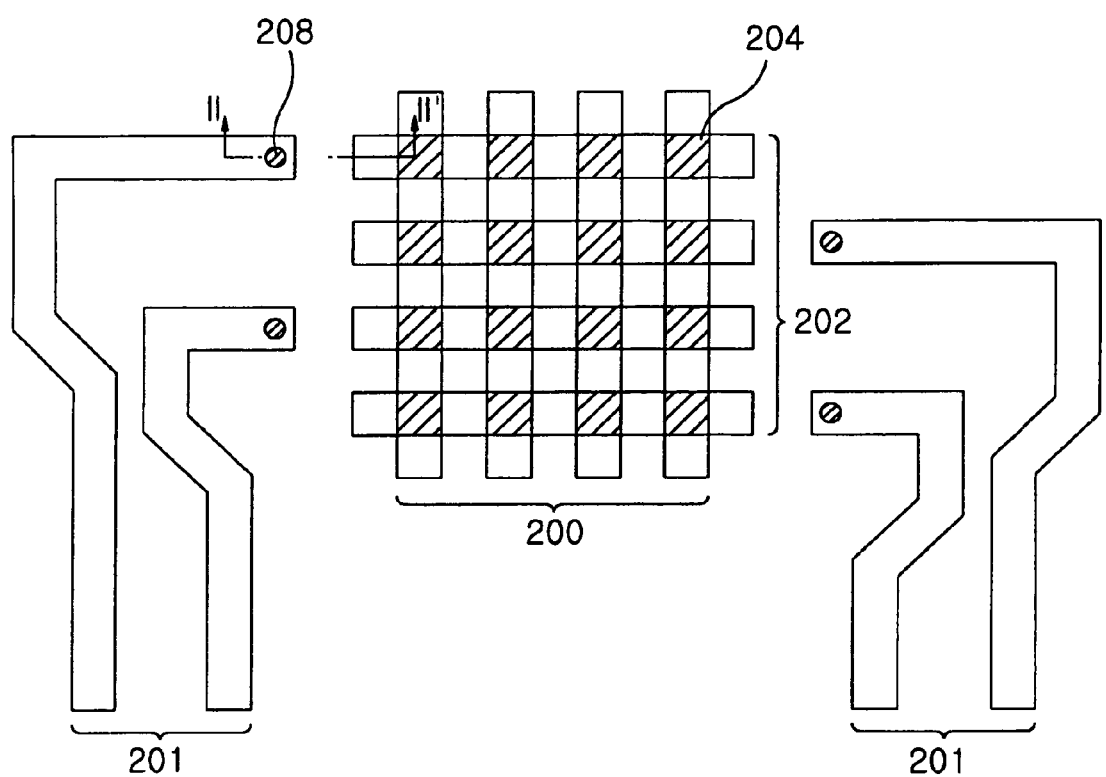
FIG. 2a is a plane view illustrating a light emitting display device according to a first embodiment of the present invention.

FIG. 2a is a plane view illustrating a light emitting display device according to the first embodiment of the present invention. In FIG. 2a, an organic electroluminescent display is illustrated for explanation purposes. However, the invention is not limited to organic electroluminescent displays.

As shown in FIG. 2a, the organic electroluminescent device embodiment of the present invention includes anode electrode layers 200, cathode electrode layers 202 and scan lines 201.

A plurality of pixels 204 are formed in luminescent areas at the crossings of the anode electrode layers 200 and the cathode electrode layers 202. ITO layers are preferred to form the anode electrode layers 200, and metal layers are preferred to form the cathode electrode layers 202. The pixels 204 emit light when a sufficient voltage differential exists between the corresponding anode electrode layer 200 and the cathode electrode layer 202. For example, a positive voltage may be applied to the anode electrode layers 200 and a negative voltage may be applied to the cathode electrode layers 202. Note that scan lines 201 correspond to the cathode electrode layers 202 respectively.

Figure 2B:
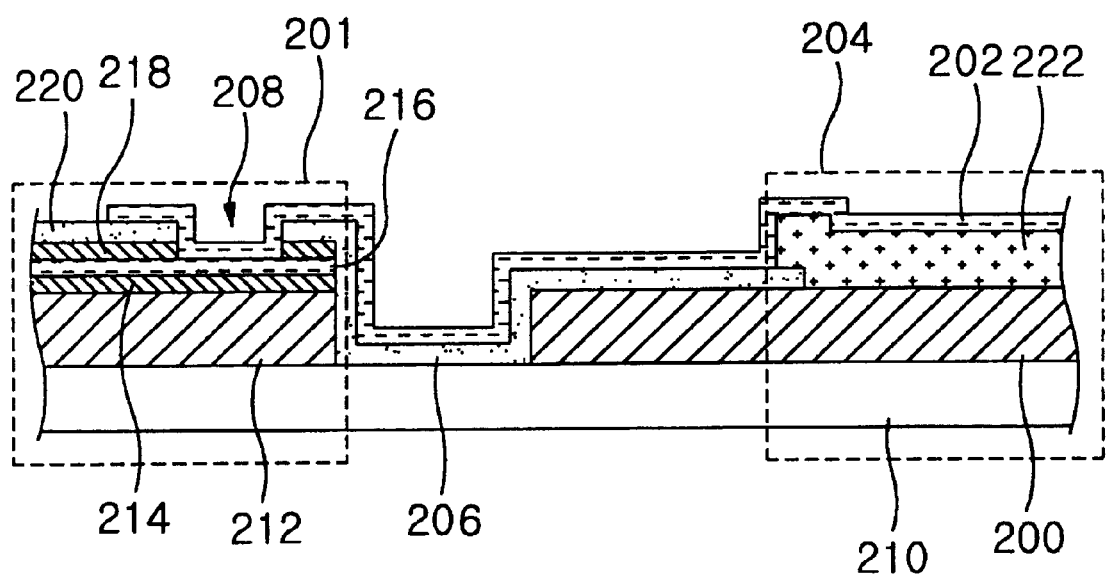
FIG. 2b is a cross-sectional view illustrating the light emitting display device of FIG. 2a as taken along line II-II'.

FIG. 2b is a cross-sectional view illustrating the light emitting display device of FIG. 2a as taken along line II-II'. As illustrated in FIG. 2b, each pixel 204 (also referred to as a pixel area or a unit pixel) includes the anode electrode layer 200, a luminescent layer 222 and the cathode electrode layer 202. An example of the luminescent layer 222 is an organic layer. The pixel area may be thought of generally as an area of the substrate covered by the organic layer 222. The organic layer 222 may comprise a hole transporting layer (HTL), an emitting layer (EML) and an electron transporting layer (ETL).

Also as illustrated in FIG. 2b, each scan line 201 (also referred to as a scan line area) includes a scan line electrode layer 212, a first sub-electrode layer 214, the conducting layer 216 and a second sub-electrode layer 218, stacked on the substrate 210. The layers 212, 214, 216 and 218 may be stacked in the sequence as shown. The scan line area may be thought of generally as an area of the substrate covered by the scan line electrode layer 212.

The first sub-electrode layer 214 prevents oxidation resulting from the contact of the scan line electrode layer 212 and the conducting layer 216, which may be a metal layer. Molybdenum (Mo) or chrome materials may be used to form the first sub-electrode layer 214.

The second sub-electrode layer 218 prevents oxidation of the conducting layer 216. Again, molybdenum or chrome material may be used to form the second sub-electrode layer 218. When moisture penetrates the conducting layer 216 in the process of manufacturing the light emitting display device, the second sub-electrode layer 218 prevents the moisture from penetrating the conducting layer 216.

The conducting layer 216 can be formed from a metal material such as aluminum.

Figure 1A:
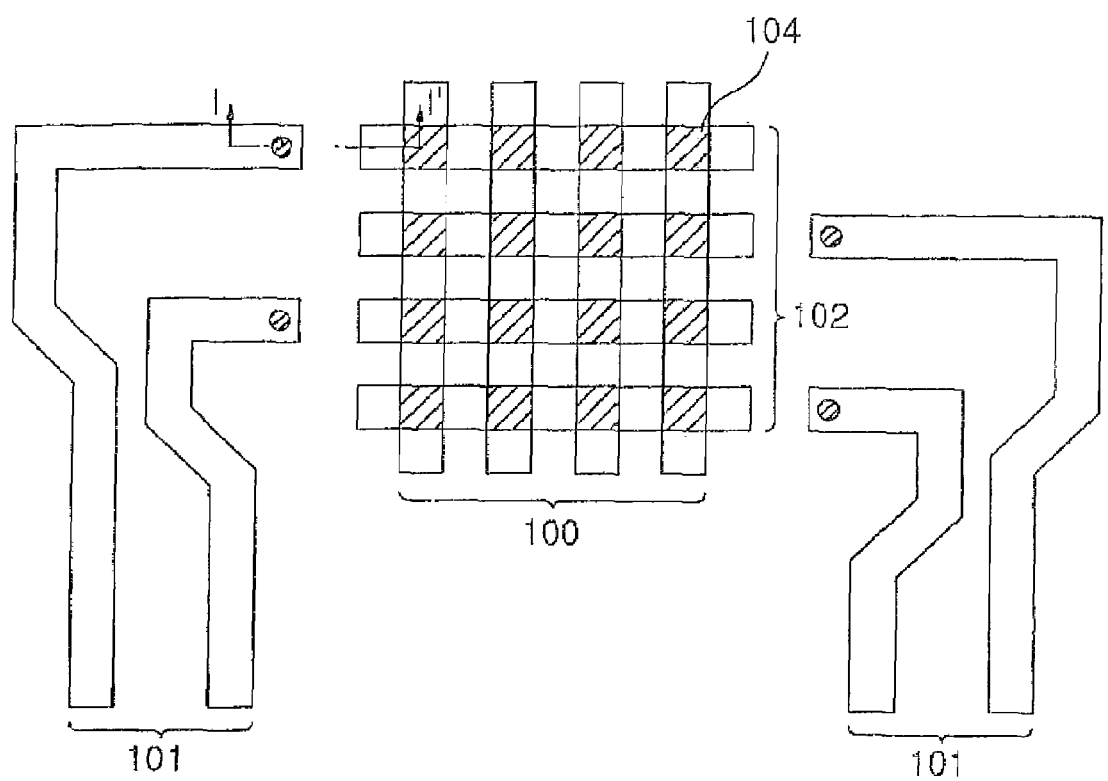
FIG. 1a is a plane view illustrating a related art organic electroluminescent device.
Figure 1B:
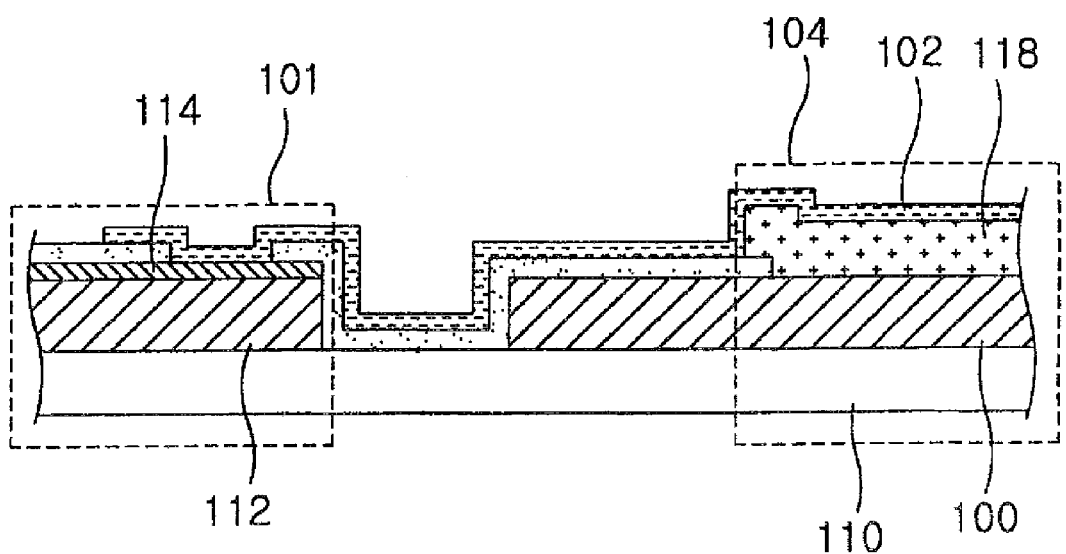

As illustrated in FIG. 2b, the scan line 201 includes a multi-layered structure on the scan line electrode layer 212, which is different from the related art organic electroluminescent device with one-layered structure on the scan line electrode layer. The multi-layered structure significantly lowers the resistance value when compared to the related art device. As a result, the scan signals transferred to the cathode electrode layer 202 through the scan line 201 and through the multi-layered structure of the present embodiment is reduced significantly less than through the related art device as illustrated in FIG. 1b.

Referring back to FIG. 2b, an insulating layer 220 is disposed on the second sub-electrode layer 218 and a via hole 208 is formed on the scan line 201 through the insulating layer 220 and the second sub-electrode layer 218 to expose a portion of the conducting layer 216. The cathode electrode layer 202 can be deposited in the via hole 208. Indeed, the upper surface of the conducting layer 216 can directly contact the cathode electrode layer 202 through the via hole 208.

FIG. 2b depicts the layers as being disposed "on" each other, i.e. in physical contact with each other. As examples, the first sub-electrode layer 214 is depicted as being on the scan line electrode layer 212, the conducting layer 216 is depicted as being on the first sub-electrode layer 214, etc.

However, this is not a strict requirement. The layers may be disposed "over" another layer. All that is necessary is that there is electrical communication between the layers such that the scan signals from the scan line electrode layer 212 can be transferred to the cathode electrode layer 202 through the multilayered structure.

To lower the overall resistance, it is preferred that the electrical conductivities of the conducting layer 216 and the cathode electrode layer 202 be essentially identical to each other. For example, if both the conducting layer 216 and the cathode electrode layer 202 are formed from the same material such as aluminum, then the conductivities of the two layers would be identical to each other.

This multilayered structure lowers the overall resistance so that the scan line signal from the scan line electrode layer 212 is transferred to the cathode electrode layer 202 without any significant degradation. As seen, the contact area between the first sub-electrode layer 214 and the conducting layer 216 is large to thereby reduce the resistance. Also, even though the contact area between the conducting layer 216 and the cathode electrode layer 202 may be relatively small, because the conductivities of these layers are substantially identical, the resistance is also lowered. As a result, the light emitting display device of the present invention can reduce power consumption more than the related art organic electroluminescent device.

The structure of the scan line 201 of the light emitting display device according to the first embodiment of the present invention can be applied to the data lines as well.

Figure 3:
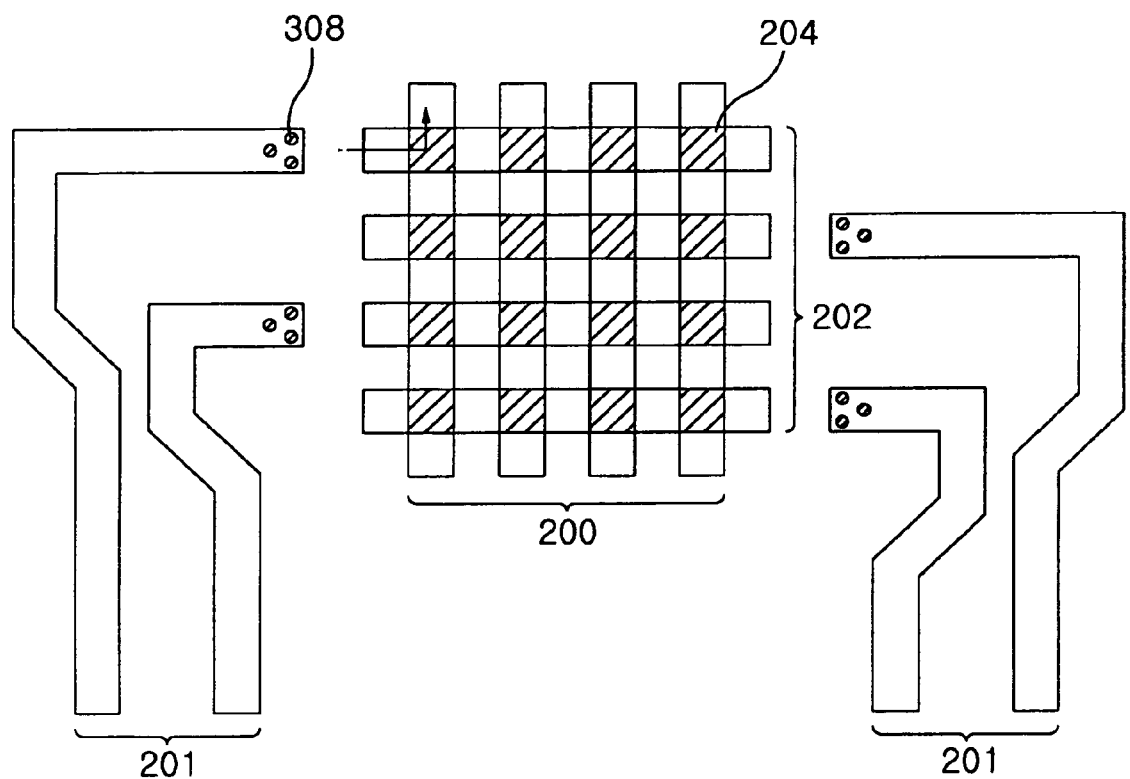
FIG. 3 is a plane view illustrating a light emitting display device according to a second embodiment of the present invention.

FIG. 3 is a plane view illustrating a light emitting display according to a second embodiment of the present invention. Again for explanatory purposes only, an organic electroluminescent device is illustrated. As shown, the organic electroluminescent device includes anode electrode layers 200, cathode electrode layers 202 and scan lines 201. The remaining elements are similar to the elements of FIG. 2a. Therefore, the description for them is omitted.

In FIG. 3, a plurality of via holes 308 are formed on each scan line 201 rather than a single via hole 208 (see FIGS. 2a and 2b). Thus, the total area of the conducting layer 216 exposed through the via holes 308, through which the cathode electrode layer 202 electrically communicates with the conducting layer 216, is larger than that of the first embodiment as illustrated in FIG. 2a. The second embodiment allows the the contact resistance value between the conducting layer 216 and the cathode electrode layer 202 to be lowered even further.

Figure 4A:
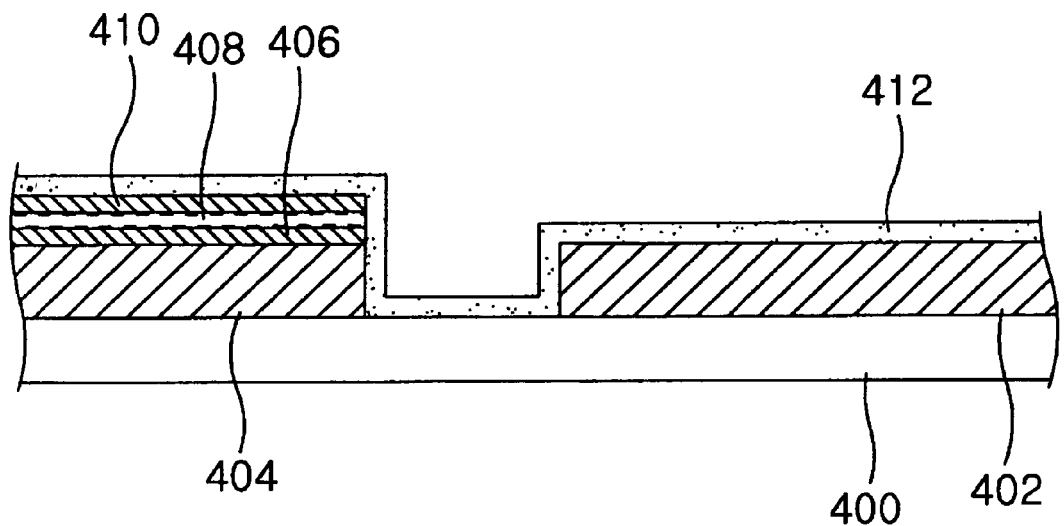
FIG. 4a to 4c is a sectional view illustrating a method of manufacturing a light emitting display device according to an embodiment of the present invention.
Figure 4B:
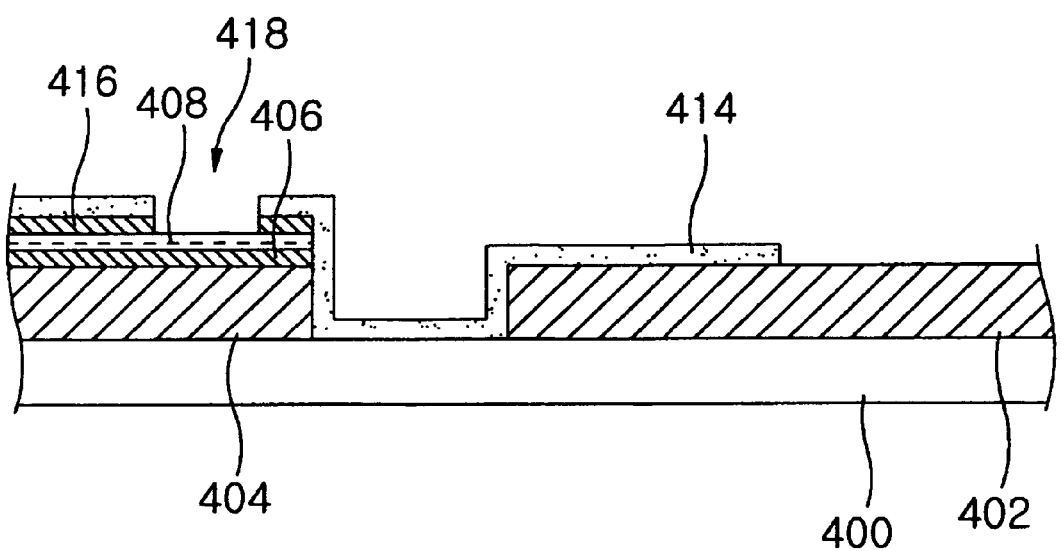
Figure 4C:
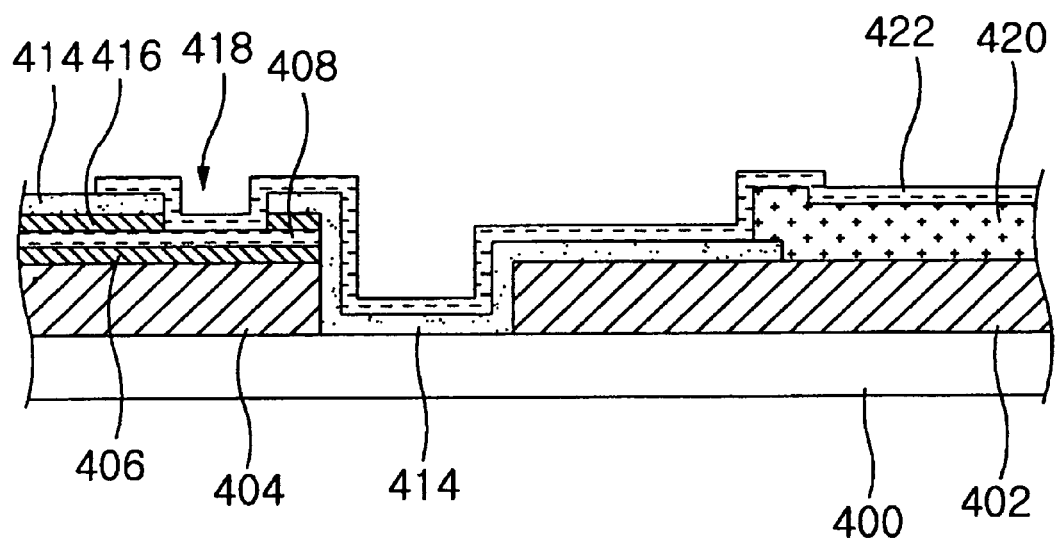

FIG. 4a to 4c are views illustrating a method of manufacturing a light emitting display device.

As illustrated in FIG. 4a, an anode electrode layer 402 and a scan line electrode layer 404 are deposited on a substrate 400. For example, ITO layers are deposited on the substrate 400, and then the ITO layers are patterned to form the anode electrode layer 402 and the scan line electrode layer 404.

Then, a first sub-electrode layer 406, a conducting layer 408 and a second sub-electrode substance 410 are deposited on the scan line electrode layer 404 in sequence. Here, aluminum may be used for the conducting layer 408 and molybdenum or chrome may be used for the first sub-electrode layer 406 and/or the second sub-electrode substance 410. Then, the insulating substance 412 is deposited to cover the anode electrode layers 402, the second sub-electrode substance 410 and the substrate 400.

As illustrated in FIG. 4b, the second sub-electrode substance 410 and the insulating substance 412 are etched to form an insulating layer 414, a second sub-electrode layer 416 and a via hole 418 to expose a portion of the conducting layer 408 in the scan line area. Also, a portion of the anode electrode layer 402 in the pixel area may be exposed through the etching process.

As illustrated in FIG. 4c, an organic layer 420 is deposited on the anode electrode layer 402. A cathode electrode layer 422 is then deposited on the exposed area of the conducting layer 408, the insulating layer 414 and the organic layer 420 to electrically connect the organic layer 420 and the conducting layer 408.

Figure 5:
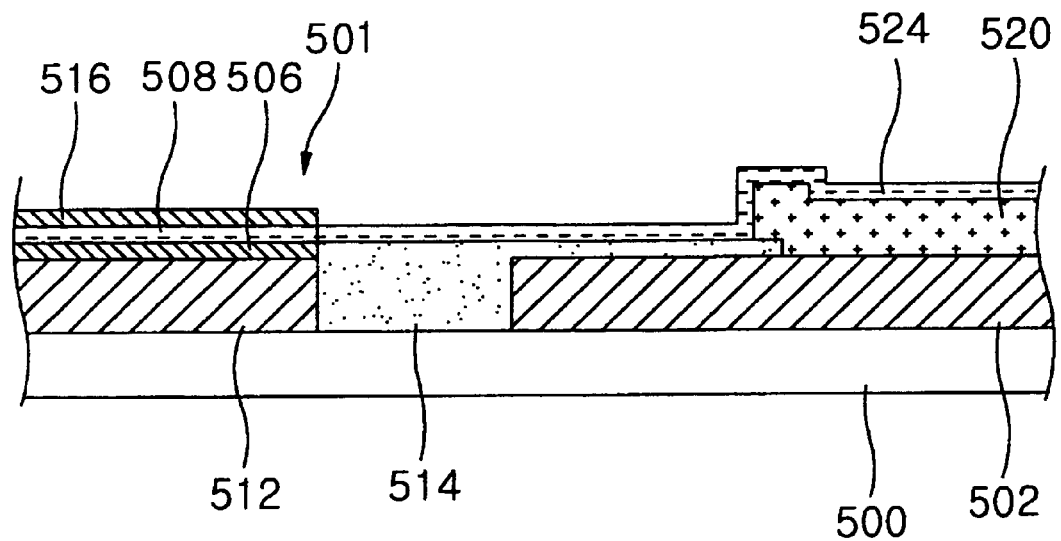
FIG. 5 is a cross-sectional view illustrating a light emitting display device according to a third embodiment of the present invention.

FIG. 5 is a cross-sectional view illustrating a light emitting display device according to a third embodiment of the present invention. The device of the third embodiment includes anode electrode layers 502, cathode electrode layers 524 and scan lines 501. The remaining elements except for the scan lines 501 are similar to the elements of the first embodiment illustrated in FIG. 2a. Therefore, the description for them is omitted.

The scan line 501 includes a scan line electrode layer 512, a first sub-electrode layer 506, a conducting layer 508 and a second sub-electrode layer 516, stacked on a substrate 500.

A supporting layer 514 is formed over the space between the scan line 501 and the anode electrode layer 502, i.e. between the scan line area and the pixel area. The height of the supporting layer 514 is such that a cathode electrode layer 524 is supported by the supporting layer 514 to extend horizontally from the scan line area at a level substantially identically to the level of the conducting layer 508. For example, the height of supporting layer 514 can be made to be substantially the same as the total height of scan line electrode layer 512 and first sub-electrode layer 506. The supporting layer 514 can be formed by extending the insulating layer formed between the anode electrode layer 502 and an organic layer 520.

The cathode electrode layer 524 electrically communicates with the conducting layer 508 through a side portion of the conducting layer 508. Indeed, the cathode electrode layer 524 can be in direct contact with the side portion of the conducting layer 508.

As noted previously, the conducting layer 508 and the cathode electrode layer 524 have substantially identical conductivities. This can be accomplished by using a same metal, for example aluminum to form both layers. Therefore, the contact resistance value between the conducting layer 508 and the cathode electrode layer 524 is low. This in turn can reduce power consumption more than the related art organic electroluminescent device.

The manufacturing process of the organic electroluminescent device according to the third embodiment of the present invention is as follows. The anode electrode layers 502 and scan lines 501 are formed spaced from each other on the substrate 500. The scan line 501 is formed by stacking the scan line electrode layer 512, the first sub-electrode layer 506, the conducting layer 508 and the second sub-electrode layer 516 in sequence. Here, aluminum may be used to form the conducting layer 508 and molybdenum or chrome may be used to form the first sub-electrode layer 506 and/or the second sub-electrode layer 516.

Then, the insulating layer is formed over the anode electrode layer 502. Luminescent areas on the anode electrode layer 502 are exposed by patterning the insulating layer.

The supporting layer 514 is formed by filling the space between the scan line 501 and the anode electrode layer 502 with the insulating layer 514. The supporting layer 514 is formed at the same height as the total height of scan line electrode layer 512 and first sub-electrode layer 506.

Then, the organic layer 520 is formed at the exposed luminescent area. The cathode electrode layer 524 is formed over the organic layer 520 and extended to the scan line 501, supported by the supporting layer 514, and to be electrically communicating with the conducting layer 508, for example through direct contact.

Figure 6:
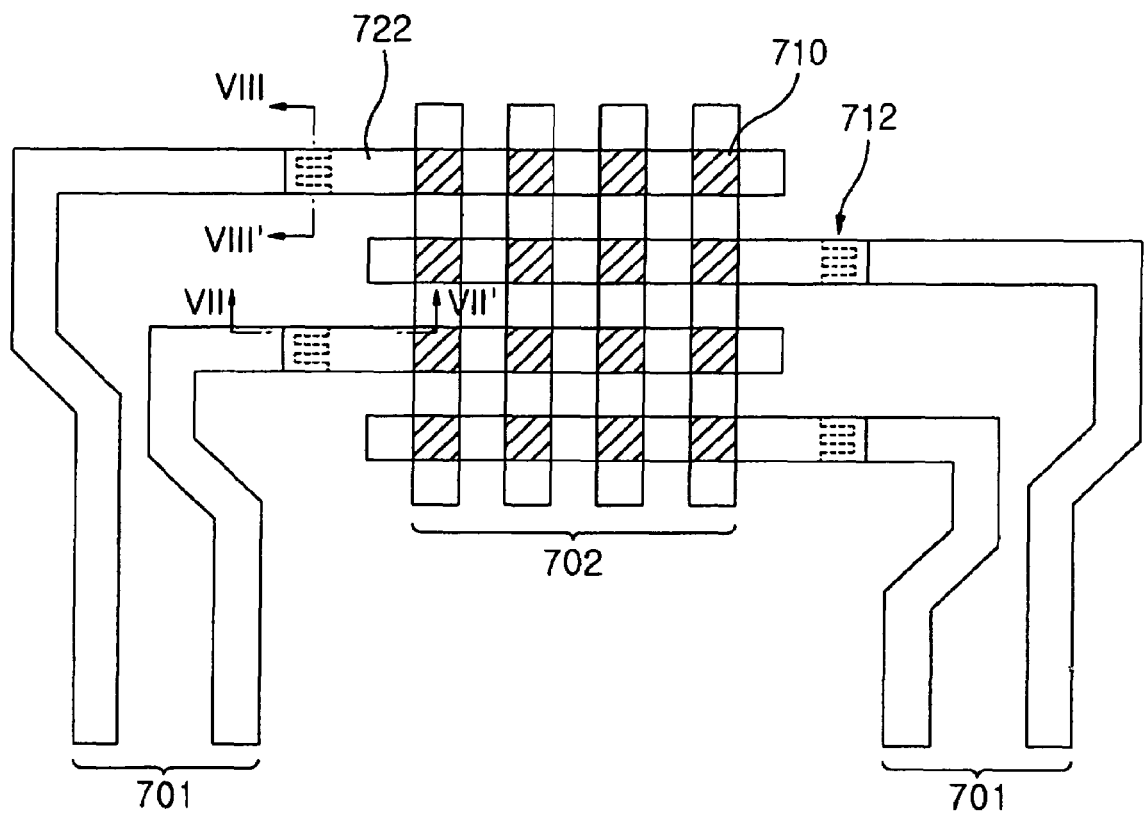
FIG. 6 is a plane view illustrating a light emitting display device according to a fourth embodiment of the present invention.
Figure 7:
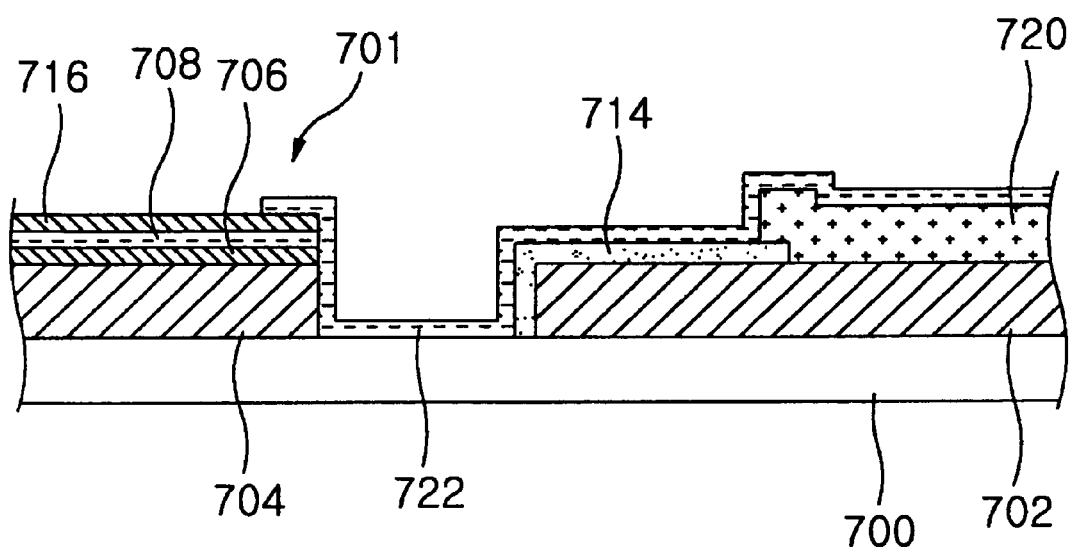
FIG. 7 is a cross-sectional view illustrating the light emitting display device of FIG. 6 as taken along line VII-VII'.
Figure 8:
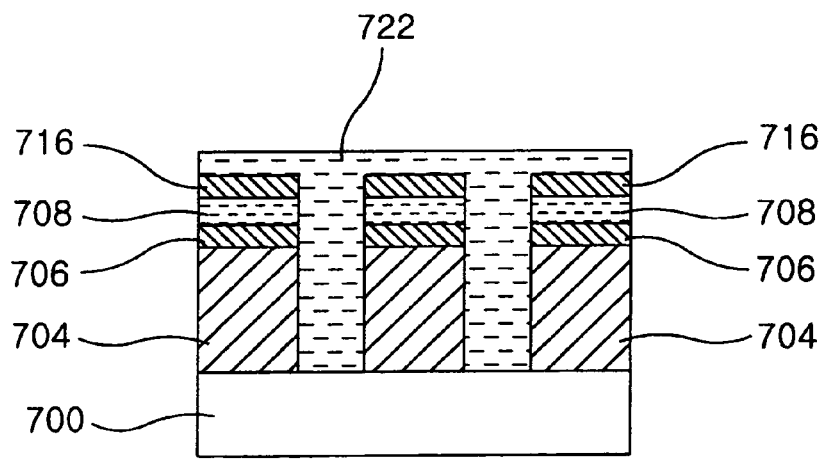
FIG. 8 is a cross-sectional view illustrating the light emitting display device of FIG. 6 as taken along line VIII-VIII'.

FIG. 6 is a plane view illustrating a light emitting display device according to a fourth embodiment of the present invention. FIG. 7 is a cross-sectional view illustrating the light emitting display device of FIG. 6 as taken along line VII-VII'. FIG. 8 is a cross-sectional view illustrating the organic electroluminescent device of FIG. 6 as taken along line VIII-VIII'.

Referring back to FIG. 6, the light emitting display device includes anode electrode layers 702, cathode electrode layers 722 and scan lines 701. The remaining elements are similar to the elements of the first embodiment illustrated in FIG. 2a. Therefore, the description for them is omitted.

As illustrated in FIG. 7, the scan line 701 includes a scan line electrode layer 704, a first sub-electrode layer 706, a conducting layer 708 and a second sub-electrode layer 716, stacked on a substrate 700. The cathode electrode layer 722 is extended to cover the end of the scan line 701. The conductivities of the cathode electrode layer 722 and the conducting layer 708 are substantially identical. Also, the cathode electrode layer 722 and the conducting layer 708 communicate electrically with each other substantially at the end of the scan line 701.

As illustrated in FIG. 8, at least one cut-out part 712 is formed at the end of the scan line 701 to increase the contact area of the cathode electrode layer 722 and the conducting layer 708. The cathode electrode layer 722 is formed to fill the cut-out part 712 to increase the contact area with the conducting layer 708.

The conducting layer 708 and the cathode electrode layer 722 can be formed from the same metal, for example aluminum. This significantly reduces the contact resistance between the conducting layer 708 and the cathode electrode layer 722 when compared to the contact resistance value between the sub-electrode layer and the cathode electrode layer of the related art. As a result, the light emitting display device of this embodiment can significantly reduce power consumption when compared to the related art device.

In FIG. 8, the cut-out part 712 is formed to expose the substrate 700 such that the cathode electrode layer 722 is filled down to the substrate 700. This has the added benefit in that the scan signal can be transferred from the scan line electrode layer 704 to the cathode electrode layer 722 to further lower the contact resistance.

However, it is not a requirement that the cut-out part 712 be formed to expose the substrate 700. It is only necessary to form the cut-out part 712 enough to expose the conducting layer 708 so that the cathode electrode layer 722 electrically communicates with the conducting layer 708.

A method of manufacturing the light emitting display device according to the fourth embodiment of the present invention is as follows.

The anode electrode layers 702 and scan lines 701 are formed spaced from each other on the substrate 700. The scan line 701 is formed by stacking the scan line electrode layer 704, the first sub-electrode layer 706, the conducting layer 708 and the second sub-electrode layer 716 in sequence. Here, aluminum may be used for the conducting layer 708 and molybdenum or chrome may be used for the first sub-electrode layer 706 and/or the second sub-electrode layer 716. Then, the cut-out part 712 is formed by etching a part of the end of the scan line 701 to expose the conducting layer 708.

Then, the insulating layer 714 is formed over the anode electrode layer 702. Luminescent areas 710 (pixel areas) on the anode electrode layer 702 are exposed by patterning the insulating layer 714. Then, the organic layer 720 is formed over the exposed luminescent area 710.

The cathode electrode layer 722 is formed to cover the end of the scan line 701 and to fill the cut-out part 712 so that electrical communication may be established with the conducting layer 708. In FIGS. 7 and 8, electrical communication is established by direct contact. However, this is not strictly necessary.

Figure 9:
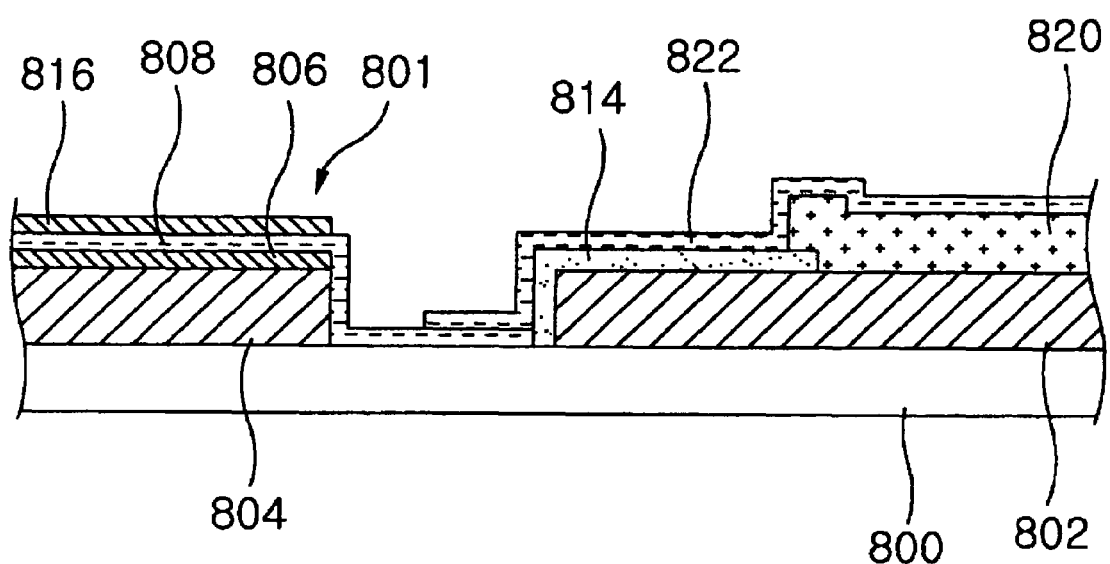
FIG. 9 is a cross-sectional view illustrating a light emitting display device according to a fifth embodiment of the present invention.

FIG. 9 is a cross-sectional view illustrating a light emitting display device according to a fifth embodiment of the present invention. As illustrated, the light emitting display device includes anode electrode layers 802, cathode electrode layers 822 and scan lines 801. The remaining elements are similar to the elements of the first embodiment illustrated in FIG. 2a. Therefore, the description for them is omitted.

The scan line 801 includes a scan line electrode layer 804, a first sub-electrode layer 806, a conducting layer 808 and a second sub-electrode layer 816, stacked on a substrate 800. The conducting layer 808 is extended to the space formed between the scan line 801 and the anode electrode layer 802, i.e. between the scan line area and the pixel area. Also, the cathode electrode layer 822 is extended to the same space to establish electrical communication with the conducting layer 808. Again, direct physical contact is one way to establish such electrical communication.

The conducting layer 808 and the cathode electrode layer 822 can be formed from the same metal, for example aluminum, so that the conductivities of the two layers are essentially identical. As a result, the contact resistance between the conducting layer 808 and the cathode electrode layer 822 is significantly reducted, and thus the device can reduce power consumption as compared to the related art device.

The manufacturing process of the light emitting display device according to the fifth embodiment of the present invention is as follows. The anode electrode layers 802 and scan lines 801 are formed to be spaced apart from each other on the substrate 800. The scan line 801 is formed by stacking the scan line electrode layer 804, the first sub-electrode layer 806, the conducting layer 808 and the second sub-electrode layer 816 in sequence. Again, aluminum may be used for the conducting layer 808 and molybdenum or chrome may be used for the first sub-electrode layer 806 and/or the second sub-electrode layer 816. The conducting layer 808 is formed to be extended to the space formed between the scan line 801 and the anode electrode layer 802.

Then, the insulating layer 814 is formed over the anode electrode layer 802. Luminescent areas on the anode electrode layer 802 are exposed by patterning the insulating layer 814. Then, the organic layer 820 is formed at the exposed luminescent area.

The cathode electrode layer 822 is formed to also extend to the space formed between the scan line 801 and the anode electrode layer 802 to establish electrical communication with the conducting layer 808, for example by direct contact.

From the above preferred embodiments for the present invention, it is noted that modifications and variations can be made by a person skilled in the art in light of the above teachings. Therefore, it should be understood that changes may be made for a particular embodiment of the present invention within the scope and the spirit of the present invention outlined by the appended claims.

What is claimed is:

1. An organic electroluminescent display device, comprising:
   a substrate divided into an pixel area and a scan line area disposed at outer side of the pixel area;
   a plurality of pixels disposed over the substrate in the pixel area; and
   a plurality of scan lines disposed over the substrate in the scan line area,
   wherein each pixel comprises an anode electrode layer, a cathode electrode layer and an organic layer disposed between the anode and cathode electrode layers, and the scan line comprises a scan line electrode layer disposed over the substrate, a first sub-electrode layer disposed over the scan line electrode layer and configured to electrically communicate with the scan line, a conducting layer disposed over the first sub-electrode layer and configured to electrically communicate with the first sub-electrode layer, and a second sub-electrode layer disposed over the conducting layer,
   wherein the cathode electrode layer extends from the pixel area towards the scan line area to be in electrical communication with the conducting layer, and
   wherein an electrical conductivity of the conducting layer is substantially identical with an electrical conductivity of the cathode electrode layer,
   wherein the cathode electrode layer is disposed to electrically connect with a side portion of the conducting layer, and
   wherein the scan line electrode layer, the first sub-electrode layer, the conducting layer, and the second sub-electrode layer are all disposed to expose at least one portion of the substrate over the scan line area, and wherein the cathode electrode layer is disposed to fill in the at least one portion of the substrate over the scan line area.

2. The device of claim 1, wherein the scan line electrode layer is disposed on the substrate, the first sub-electrode layer is disposed on the scan line electrode layer, the conducting layer is disposed on the first sub-electrode layer, and the second sub-electrode layer is disposed on the conducting layer in the scan line area, and wherein the anode electrode layer is disposed on the substrate, the organic layer is disposed on the anode electrode layer, and the cathode electrode layer is disposed on the organic layer in the pixel area.

3. The device of claim 1, wherein the cathode electrode layer and the conducting layer are formed from a same conductive material.

4. The device of claim 3, wherein the conductive material is aluminum.

5. The device of claim 1, wherein one or both of the first sub-electrode layer and the second electrode layer are formed from molybdenum or from chrome.

6. A structure to provide display signals to a light emitting display having a substrate divided into an pixel area and a scan line area disposed at outer side of the pixel area, comprising:
   a scan line comprising a scan line electrode layer disposed over the substrate in the scan line area, and a conducting layer disposed over the scan line electrode layer in the scan line area and configured to electrically communicate with the scan line electrode layer;

a cathode electrode layer disposed over the substrate in the pixel area to extend from the pixel area of the light emitting display; and a organic layer disposed between the cathode electrode layer and an anode electrode layer, wherein the conducting layer and the cathode electrode layer are configured to electrically communicate with each other, and wherein an electrical conductivity of the conducting layer is substantially identical with an electrical conductivity of the cathode electrode layer, and wherein the conducting layer is disposed to extend over the substrate in an area of the substrate not covered by the scan line electrode layer, and wherein the cathode electrode layer is disposed to extend from the pixel area over the substrate so as to be in electrical communication with the conducting layer at the area of the substrate not covered by the scan line electrode layer.

7. The structure of claim 6, wherein the cathode electrode layer is disposed to be in direct contact with the conducting layer.

8. The structure of claim 6, wherein the cathode electrode layer and the conducting layer are formed from a same conductive material.

9. The structure of claim 8, wherein the conductive material is aluminum.

10. The structure of claim 6, further comprising a sub-electrode layer disposed over the conducting layer, wherein the sub-electrode layer is formed from a material different from the conducting layer.

11. The structure of claim 10, wherein the sub-electrode layer is formed from molybdenum or chrome.

12. The structure of claim 10, wherein the sub-electrode layer is a second sub-electrode layer, the structure further comprising a first sub-electrode layer disposed in between the scan line electrode layer and the conducting layer, and wherein the first sub-electrode layer is formed from a material different from the conducting layer.

13. The structure of claim 12, wherein the first sub-electrode layer is formed from molybdenum or chrome.

14. The structure of claim 6, further comprising:
a first sub-electrode layer disposed in between the scan line electrode layer and the conducting layer; and
a second sub-electrode layer disposed over the conducting layer,
wherein the first and second sub-electrode layers are formed from materials different from the conducting layer.

15. The structure of claim 6, wherein the anode electrode layer is disposed over the substrate in the pixel area and crossing the cathode electrode layer, the organic layer is disposed over the anode electrode layer, and the cathode electrode layer is disposed over the organic layer.

16. The structure of claim 6, wherein the light emitting display device is an organic luminescent device.

17. The structure of claim 6, wherein the scan line electrode layer is disposed on the substrate.

18. The structure of claim 17, further comprising:
a first sub-electrode layer disposed on the scan line electrode layer, wherein the conducting layer is disposed on the first sub-electrode layer; and
a second sub-electrode layer disposed on the conducting layer,
wherein the first and second sub-electrode layers are formed from materials different from the conducting layer.

19. A structure to provide display signals to a light emitting display, comprising:
a scan line electrode layer disposed over a substrate;
a conducting layer disposed over the scan line electrode layer and configured to electrically communicate with the scan line electrode layer; and
a cathode electrode layer disposed over the substrate to extend from a pixel area of the light emitting display,
wherein the conducting layer and the cathode electrode layer are configured to electrically communicate with each other,
wherein an electrical conductivity of the conducting layer is substantially identical with an electrical conductivity of the cathode electrode layer,
wherein the conducting layer is disposed to extend over the substrate in an area of the substrate not covered by the scan line electrode layer, and
wherein the cathode electrode layer is disposed to extend from the pixel area over the substrate so as to be in electrical communication with the conducting layer at the area of the substrate not covered by the scan line electrode layer.

* * * * *